(12) United States Patent
Lee et al.

(10) Patent No.: US 12,146,216 B2
(45) Date of Patent: Nov. 19, 2024

(54) SUBSTRATE TREATMENT APPARATUS HAVING EXHAUST STRUCTURE

(71) Applicant: DEVICEENG CO. LTD, Chungcheongnam-do (KR)

(72) Inventors: Taek Youb Lee, Chungcheongnam-do (KR); Jun Hwan Lee, Chungcheongnam-do (KR); Man Je Bang, Chungcheongnam-do (KR)

(73) Assignee: DEVICEENG CO., LTD., Chungcheongnam-do (KR)

( * ) Notice: Subject to any disclaimer, the term of this patent is extended or adjusted under 35 U.S.C. 154(b) by 381 days.

(21) Appl. No.: 17/562,746

(22) Filed: Dec. 27, 2021

(65) Prior Publication Data
US 2023/0080325 A1 Mar. 16, 2023

(30) Foreign Application Priority Data
Sep. 10, 2021 (KR) ........................ 10-2021-0120968

(51) Int. Cl.
*H01L 21/67* (2006.01)
*B08B 15/00* (2006.01)
*C23C 16/44* (2006.01)

(52) U.S. Cl.
CPC .......... *C23C 16/4412* (2013.01); *B08B 15/00* (2013.01); *H01L 21/67023* (2013.01); *B08B 2203/0264* (2013.01); *H01L 21/6719* (2013.01)

(58) Field of Classification Search
None
See application file for complete search history.

(56) References Cited

U.S. PATENT DOCUMENTS

| 9,355,835 B2 | 5/2016 | Lee |
| 10,755,950 B2 | 8/2020 | Nakai |
| 2014/0000659 A1* | 1/2014 | Lee ................... H01L 21/67075 134/99.1 |

(Continued)

FOREIGN PATENT DOCUMENTS

| JP | 2016134514 A | 7/2016 |
| KR | 20140025651 A | 3/2014 |

(Continued)

OTHER PUBLICATIONS

KR 2019-0074852 translation, Apparatus For Treating Substrate And The Method Thereof, Park (Year: 2019).*

*Primary Examiner* — Cristi J Tate-Sims
(74) *Attorney, Agent, or Firm* — BLANK ROME LLP

(57) ABSTRACT

The present invention relates to a substrate treatment apparatus including: a substrate support assembly having a spin head adapted to seat a substrate thereonto; fluid supply unit for supplying fluid to the substrate; a bowl assembly having a plurality of bowls overlaid another outwardly in a radial direction thereof and surrounding the substrate support assembly; an ascending and descending unit for moving up and down the bowl assembly; and a chamber for accommodating the substrate support assembly, the fluid supply unit, the bowl assembly, and the ascending and descending unit, wherein the chamber is configured to have a plurality of process exhaust parts for performing exhaust from the inside of the bowl assembly and an environment exhaust part for performing exhaust from the outside of the bowl assembly.

8 Claims, 7 Drawing Sheets

(56) References Cited

U.S. PATENT DOCUMENTS

2014/0137893 A1   5/2014   Otsuka et al.
2017/0008044 A1   1/2017   Okumura et al.
2017/0361364 A1   12/2017  Ogata et al.

FOREIGN PATENT DOCUMENTS

KR   20190074852 A   6/2019
TW      201233297 A   8/2012
TW      201440133 A   10/2014

* cited by examiner

PRIOR ART

SUBSTRATE TREATMENT APPARATUS HAVING EXHAUST STRUCTURE

CROSS REFERENCE TO RELATED APPLICATION OF THE INVENTION

The present application claims the benefit of Korean Patent Application No. 10-2021-0120968 filed in the Korean Intellectual Property Office on Sep. 10, 2021, the entire contents of which are incorporated herein by reference.

BACKGROUND OF THE INVENTION

Field of the Invention

The present invention relates to a substrate treatment apparatus having an exhaust structure, and more specifically, to a substrate treatment apparatus having an exhaust structure that is capable of being configured to have two or more bowls movable independently of each other.

Background of the Related Art

Generally, a semiconductor device is manufactured by depositing and patterning various materials on a substrate to the shape of thin films, and in the manufacturing process, different steps such as deposition, photolithography, etching, cleaning, and drying are needed.

Among them, the cleaning and drying processes are performed to remove foreign substances or particles from the substrate and to then dry the substrate. In a state where the substrate is supported on top of a spin head (chuck base), first, a treatment solution is supplied to top or underside of the substrate, while the spin head is rotating at a high speed.

As shown in FIG. 1, a substrate treatment apparatus 1 generally includes fluid supply unit 300, a bowl assembly 100, an ascending and descending unit 600, and a substrate support assembly 200 having a spin head 210.

The fluid supply unit 300 supplies treatment liquids (chemical liquids) or gases for treating a substrate W to the substrate W.

The substrate support assembly 200 serves to rotate the substrate W in a state of supporting the substrate W, while a given treatment is being carried out.

Further, the bowl assembly 100 serves to receive chemical liquids used for treatments and fumes generated during the treatments to prevent the chemical liquids and fume from scattering or flowing to the outside and has a stacked structure of bowls so that different kinds of chemical liquids and fumes are separatedly introduced into passages formed by the bowls according to the passages of the bowls with respect to the substrate W.

The ascending and descending unit 600 serves to move up and down the substrate support assembly 200 or the bowl assembly 100 to change a relative height between the bowl assembly 100 and the substrate support assembly 200 within the bowl assembly 100.

Further, the fluid supply unit 300, the bowl assembly 100, the ascending and descending unit 600, and the substrate support assembly 200 having the spin head 210 are accommodated in a chamber 800, and only through an exhaust member 400 connected to the outside of the chamber 800, fumes generated from the droplets of treatment liquids introduced into the bowl assembly 100 are exhausted.

The chamber 800 has a fan filter unit 850 disposed on top side thereof to supply external air to the interior thereof.

According to the conventional substrate treatment apparatus 1, however, the fumes in multi-stacked bowls 110, 120, and 130 are exhausted at a time through exhaust ducts 190 and an exhaust line 410.

Besides, there is no structure for exhausting the fumes existing in the outside of the bowl assembly 100, and only through the exhaust member 400, that is, all of the fumes in the bowl assembly 100 are exhausted at a time, thereby undesirably causing inconveniences in post-treatments of the treatment liquids.

Like this, the treatment liquids are all exhausted, irrespective of their kinds, and then mixedly collected to one place, thereby undesirably increasing post-treatment costs.

SUMMARY OF THE INVENTION

Accordingly, the present invention has been made in view of the above-mentioned problems occurring in the related art, and it is an object of the present invention to provide a substrate treatment apparatus having an exhaust structure that is capable of allowing fumes generated from treatment liquids to be sortedly exhausted from a bowl assembly constituted of a plurality of bowls and fumes existing in the outside of the bowl assembly to be separatedly exhausted, thereby greatly reducing post-treatment costs of the treatment liquids.

To accomplish the above-mentioned objects, according to the present invention, there is provided a substrate treatment apparatus including: a substrate support assembly having a spin head adapted to seat a substrate thereonto; fluid supply unit for supplying fluid to the substrate; a bowl assembly having a plurality of bowls overlaid one another outwardly in a radial direction thereof and surrounding the substrate support assembly; an ascending and descending unit for moving up and down the bowl assembly; and a chamber for accommodating the substrate support assembly, the fluid supply unit, the bowl assembly, and the ascending and descending unit, wherein the chamber is configured to have a plurality of process exhaust parts for performing exhaust from the inside of the bowl assembly and an environment exhaust part for performing exhaust from the outside of the bowl assembly.

According to the present invention, desirably, the outer peripheral surface of the bowl assembly is surrounded by the ring-shaped first duct for communicating with the environment exhaust part.

According to the present invention, desirably, the first duct has a plurality of first introducing holes spaced apart from one another on top thereof along a periphery thereof to introduce gases of treatment liquids existing in the chamber thereinto.

According to the present invention, desirably, the bowl assembly may include a ring-shaped outer wall disposed adjacent to the outer bowl among the bowls downwardly and second introducing holes are formed on the outer wall and communicating with a first process exhaust part of the process exhaust parts.

According to the present invention, desirably, the outer peripheral surface of the bowl assembly is surrounded by the ring-shaped first duct for communicating with the environment exhaust part and a ring-shaped second duct is disposed adjacent to the first duct thereunder and communicating with the second introducing holes and the first process exhaust part.

According to the present invention, desirably, the inner bowl among the bowls may include a ring-shaped introducing groove formed on the outside thereof in up and down directions, a ring-shaped first compartment formed opposite to the introducing groove in a state of placing an inner wall of the introducing groove therebetween, first connection holes are formed on the inner wall of the introducing groove and communicate with the first compartment, and first exhaust holes are formed on the bottom of the first compartment and communicate with a second process exhaust part of the process exhaust parts.

According to the present invention, desirably, the first connection holes are slant upwardly from inlets thereof toward outlets thereof.

According to the present invention, desirably, the first exhaust holes are long holes extended along the periphery of the inner bowl and spaced apart from one another.

According to the present invention, desirably, a ring-shaped second compartment and a ring-shaped third compartment are formed adjacent to each other in up and down directions on the lower portion of the inner portion spaced apart from the first compartment, the second compartment comprises an introducing hole formed on an outer wall thereof to introduce gases exhausted from the first exhaust holes and second connection holes formed on bottom thereof and communicating with the third compartment, and the third compartment comprises a second exhaust hole communicating with the second process exhaust part.

According to the present invention, desirably, the bowl assembly has the inner bowl, the intermediate bowl, and the outer bowl, a ring-shaped intermediate wall is formed extended downwardly from the intermediate bowl to separate the first process exhaust part and the second process exhaust part from each other, and a passage between the inner bowl and the intermediate bowl communicates with the first exhaust holes, the second exhaust hole and the second process exhaust part, sequentially.

BRIEF DESCRIPTION OF THE DRAWINGS

The above and other objects, features and advantages of the present invention will be apparent from the following detailed description of the embodiments of the invention in conjunction with the accompanying drawings, in which.

DETAILED DESCRIPTION OF THE PREFERRED EMBODIMENT

Figure 1:
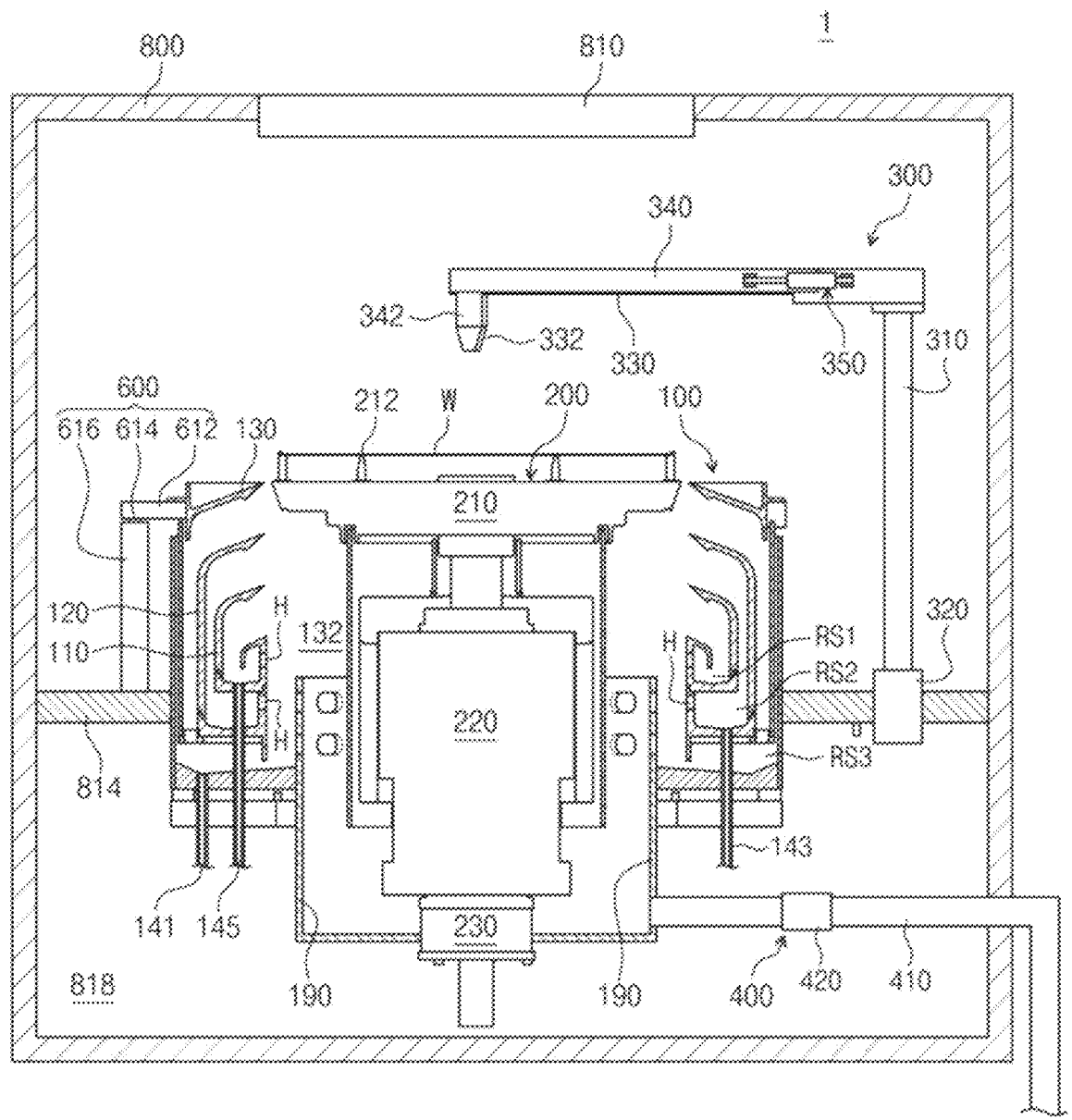
FIG. 1 is a side sectional view showing a conventional substrate treatment apparatus.

Hereinafter, an embodiment of the present invention will be explained in detail with reference to the attached drawings.

As shown in FIGS. 2 to 5, a substrate treatment apparatus 1000 according to the present invention includes a substrate support assembly 100 having a spin head 110 adapted to seat a substrate W thereonto, fluid supply unit 200 for supplying fluid such as a chemical liquid or gas to the substrate W, a bowl assembly 300 having a plurality of bowls 310, 320 and 330 overlaid one another outwardly in a radial direction thereof and surrounding the substrate support assembly 100, and an ascending and descending unit being not shown for moving up and down the bowl assembly 300.

In specific, the bowls 310, 320, and 330 constituting the bowl assembly 300 move up and down independently of one another, and accordingly, an intermediate passage 352 and an outer passage 353 among the bowls are appropriately adjusted in width according to given situations.

According to the present invention, an inner passage 351 is formed inside the inner bowl 310 itself.

In the drawings, the bowl assembly 300 has three bowls 310, 320, and 330, but of course, the bowl assembly 300 may have two or four or more bowls according to situations or use purposes thereof.

The substrate support assembly 100, the fluid supply unit 200, the bowl assembly 300, and the ascending and descending unit are accommodated in a chamber 800.

Further, the chamber 800 is configured to have a plurality of process exhaust parts 810 for exhausting the droplets of treatment liquids introduced into the bowl assembly 300 and an environment exhaust part 820 for exhausting the droplets existing on the outside of the bowl assembly 300.

Accordingly, the treatment liquids introduced into the bowl assembly 300 can be sortedly exhausted and collected according to their kinds, and next, the gases generated from the treatment liquids can be sortedly post-treated, thereby greatly reducing the post-treatment costs.

Further, a ring-shaped first duct 510 is surrounded along the outer peripheral surface of the bowl assembly 300 and communicates with the environment exhaust part 820 to easily exhaust the droplets existing on the outside of the bowl assembly 300.

In specific, the first duct 510 has a plurality of first introducing holes 511 spaced apart from one another along the top periphery thereof to introduce the gases existing in the chamber 800 thereinto, thereby efficiently exhausting the gases through the environment exhaust part 820.

The environment exhaust part 820 is disposed on one side of the outer peripheral surface of the first duct 510 to exhaust the gases generated from the treatment liquids.

As the first duct 510 is disposed to the optimized shape on the circular substrate W, accordingly, the first duct 510 prevents a vortex from occurring when clean air moves down from a fan filter unit 850 disposed on top of the chamber 800, thereby suppressing the noise and vibration caused by the vortex.

Further, a ring-shaped outer wall 520 is disposed adjacent to the outer bowl 330 among the bowls 310, 320, and 330, downwardly, and the outer wall 520 has second introducing holes 521 communicating with a first process exhaust part 811 of the process exhaust parts 810, so that the gases of the treatment liquid introduced into the passage between the outer bowl 330 and the intermediate bowl 320 adjacent inwardly to the outer bowl 330 can pass through the second introducing holes 521 and be exhausted through the first process exhaust part 811.

In this case, a ring-shaped second duct 530 is disposed adjacent to the first duct 510 under the first duct 510, and the second duct 530 communicates with the second introducing holes 521 and the first process exhaust part 811, thereby providing a compact structure.

Of course, the first duct 510 and the second duct 530 are completely separated from each other by means of the outer wall 520, so that the gases existing therein cannot be mixed with each other.

Further, the inner bowl 310 among the bowls 310, 320, and 330 includes a ring-shaped introducing groove 540 formed on the inside thereof in up and down directions, a ring-shaped first compartment 610 formed opposite to the introducing groove 540 in a state of placing an inner wall 541 of the introducing groove 540 therebetween, first connection holes 542 are formed on the inner wall 541 of the introducing groove 540 and communicate with the first compartment 610, first exhaust holes 611 are formed on the bottom of the first compartment 610 and communicate with a second process exhaust part 812 of the process exhaust parts 810.

Accordingly, the mist-shaped droplets of the treatment liquid pass through such a passage complicated in structure, so that the liquid and gas constituting the droplets can be easily sorted and exhausted.

That is, the liquid components contained in the treatment liquid are dropped to a bottom B and separately drained, and the gaseous components contained therein are exhausted to the outside through the second process exhaust part 812 and separately stored.

Accordingly, the post-treatment processes for the treatment liquid can be simply carried out, and further, the post-treatment costs can be greatly reduced.

In specific, the first connection holes 542 are slant upwardly from inlets thereof toward outlets thereof, and accordingly, when the droplets of the treatment liquid passing come into contact with the keen top end portions of the first connection holes 542 and pass therethrough, the separation between the liquid and the gas can be easily carried out.

The path passing through the introducing groove 540, the first connection holes 542, and the first exhaust holes 611 has a roughly N-like shape.

Further, the first exhaust holes 611 are long holes extended along the periphery of the inner bowl 310 and spaced apart from one another, so that the droplets of the treatment liquid can be uniformly exhausted in a circumferential direction of the inner bowl 310 to prevent vibrations from being generated due to a pressure difference.

Further, a ring-shaped second compartment 620 and a ring-shaped third compartment 630 are formed adjacent to each other in up and down directions on the lower portion of the inner portion spaced apart from the first compartment 610, and the second compartment 620 has an introducing hole 622 formed on an outer wall 621 thereof to introduce the droplets of the treatment liquid exhausted from the first exhaust holes 611 and second connection holes 623 formed on bottom thereof and communicating with the third compartment 630. Further, the third compartment 630 has a second exhaust hole 631 communicating with the second process exhaust part 812.

Through the additional path, further, the separation between the liquid and the gas can be more reliably carried out.

Figure 5:
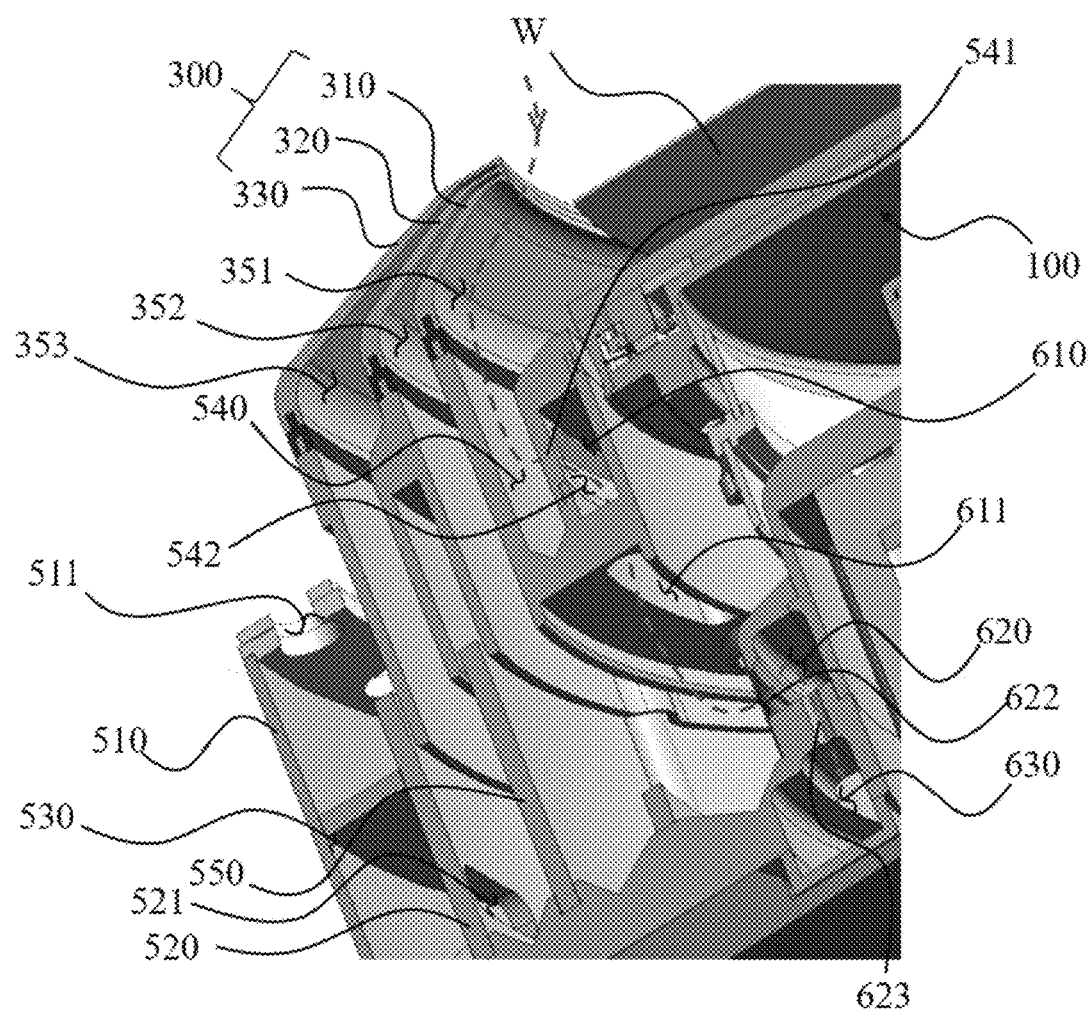
FIG. 5 is a sectional perspective view showing the underside of a portion of the substrate treatment apparatus having an exhaust structure according to the present invention.

As shown in FIG. 5, the treatment liquid is introduced into the inner passage 351 of the bowl assembly 300 and the ring-shaped introducing groove 540 and moves to the first compartment 610 through the first connection holes 542, and next, the treatment liquid is introduced into the second compartment 620 and the third compartment 630 through the first exhaust holes 611 formed on the bottom of the first compartment 610.

Figure 4:
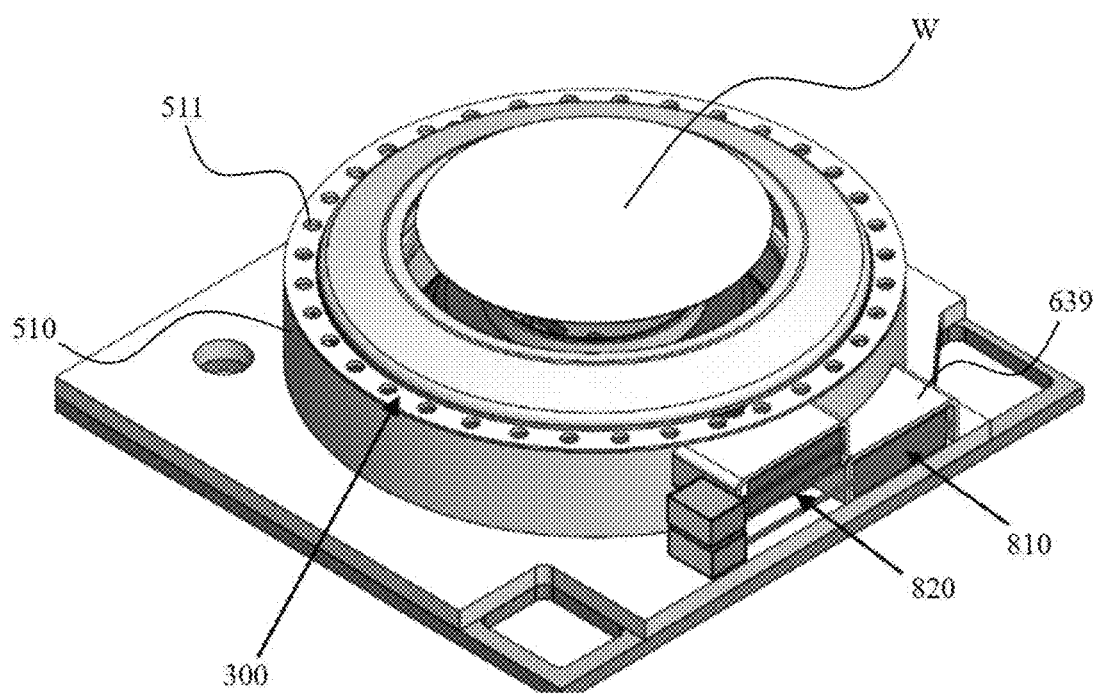
FIG. 4 is a perspective view showing the substrate treatment apparatus having an exhaust structure according to the present invention.

As shown in FIG. 4, the third compartment 630 has a connection port 639 formed thereon and transversely passing through the first duct 510 to thus connect the second exhaust hole 631 and the second process exhaust part 812.

Further, the bowl assembly 300 has the inner bowl 310, the intermediate bowl 320, and the outer bowl 330, and further, a ring-shaped intermediate wall 550 is formed extended downwardly from the intermediate bowl 320 to thus separate the first process exhaust part 811 and the second process exhaust part 812 from each other. Also, the passage between the inner bowl 310 and the intermediate bowl 320 communicates with the first exhaust holes 611, the second exhaust hole 631, and the second process exhaust part 812, sequentially.

That is, in the case where the bowl assembly 300 has the inner bowl 310, the intermediate bowl 320, and the outer bowl 330, the droplets of the treatment liquid introduced between the outer bowl 330 and the intermediate bowl 320 are exhausted through the first process exhaust part 811, and the droplets of the treatment liquid introduced into the inner bowl 310 and the passage between the inner bowl 310 and the intermediate bowl 320 are exhausted through the second process exhaust part 812.

Figure 2:
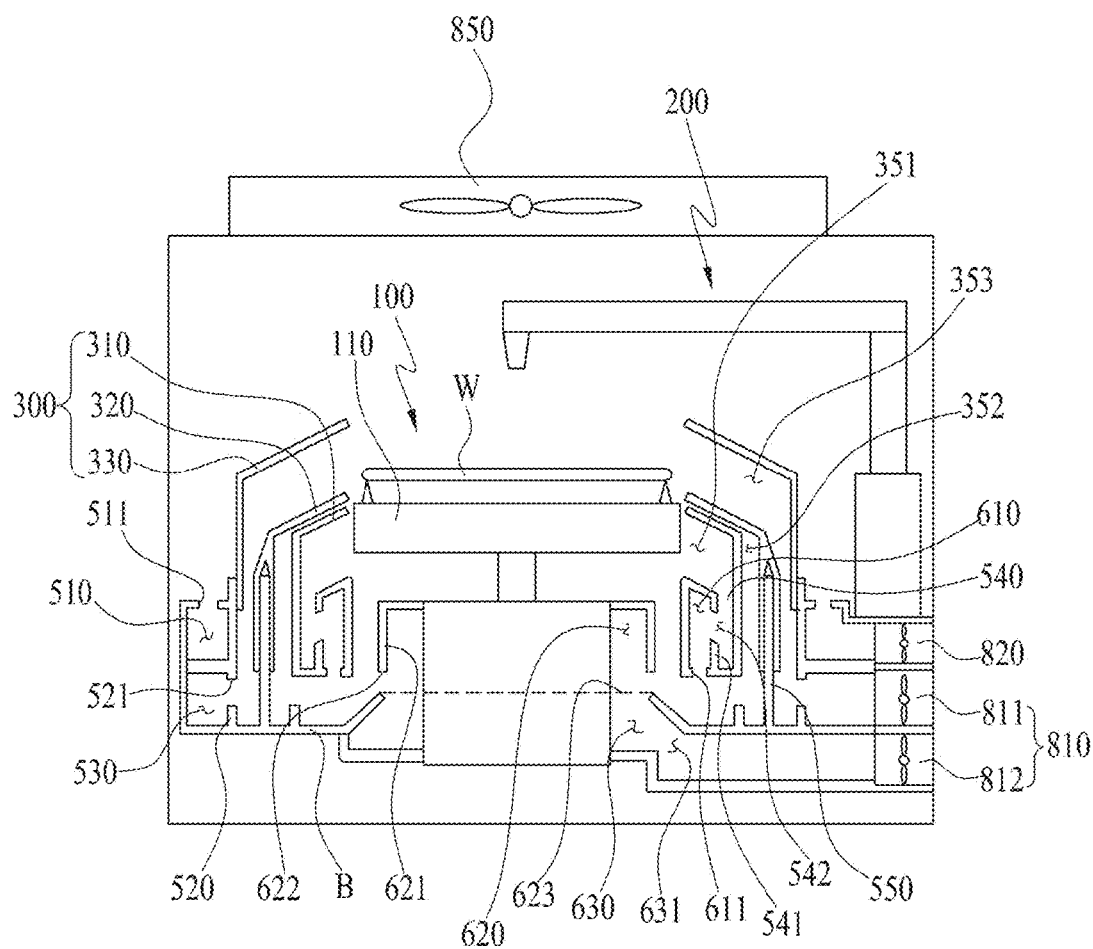
FIG. 2 is a front sectional view showing a substrate treatment apparatus having an exhaust structure according to the present invention.
Figure 3A:
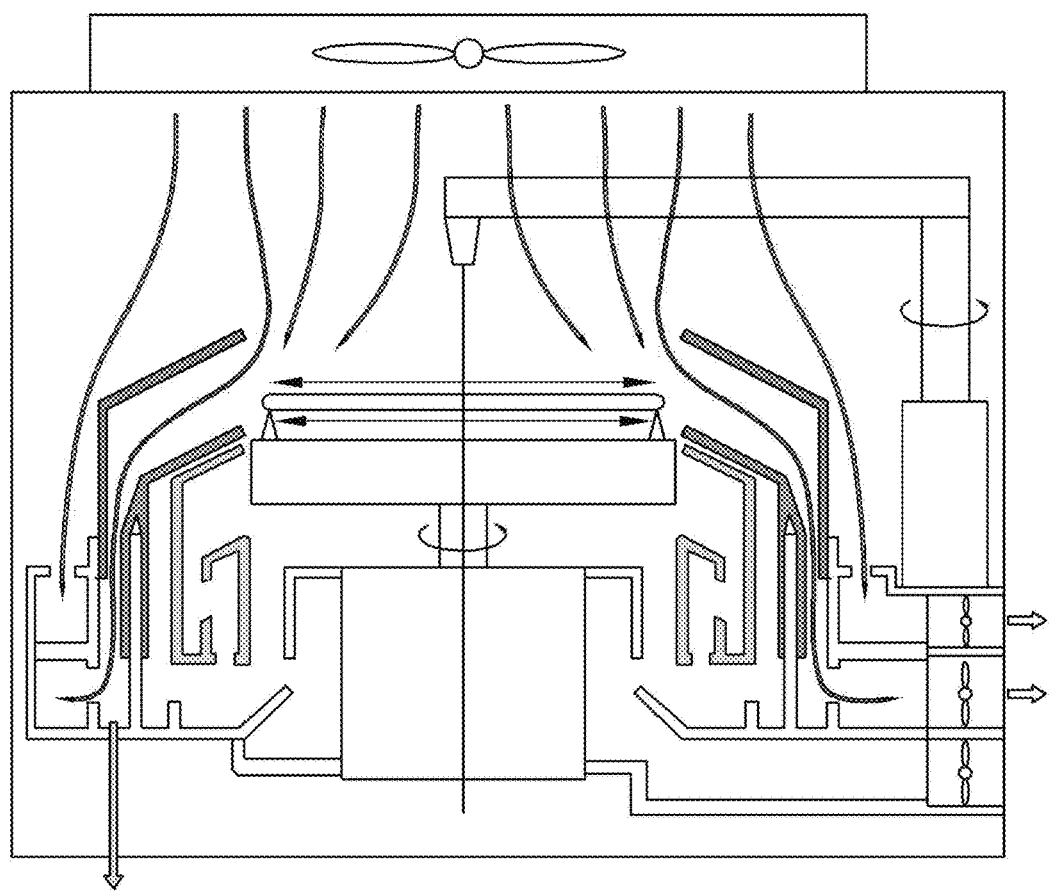
FIG. 3A is a front sectional view showing air flows exhausted through an outer passage of the bowl assembly of FIG. 2.
Figure 3B:
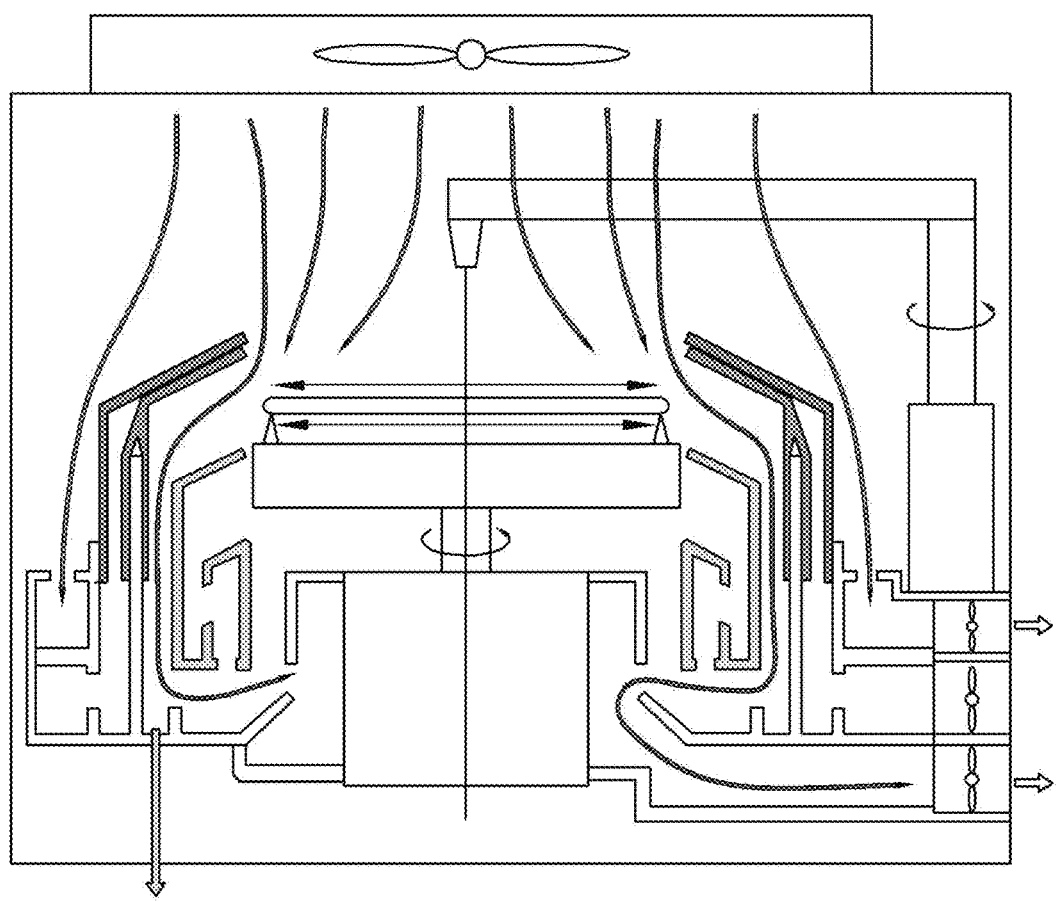
FIG. 3B is a front sectional view showing air flows exhausted through an intermediate passage of the bowl assembly of FIG. 2.
Figure 3C:
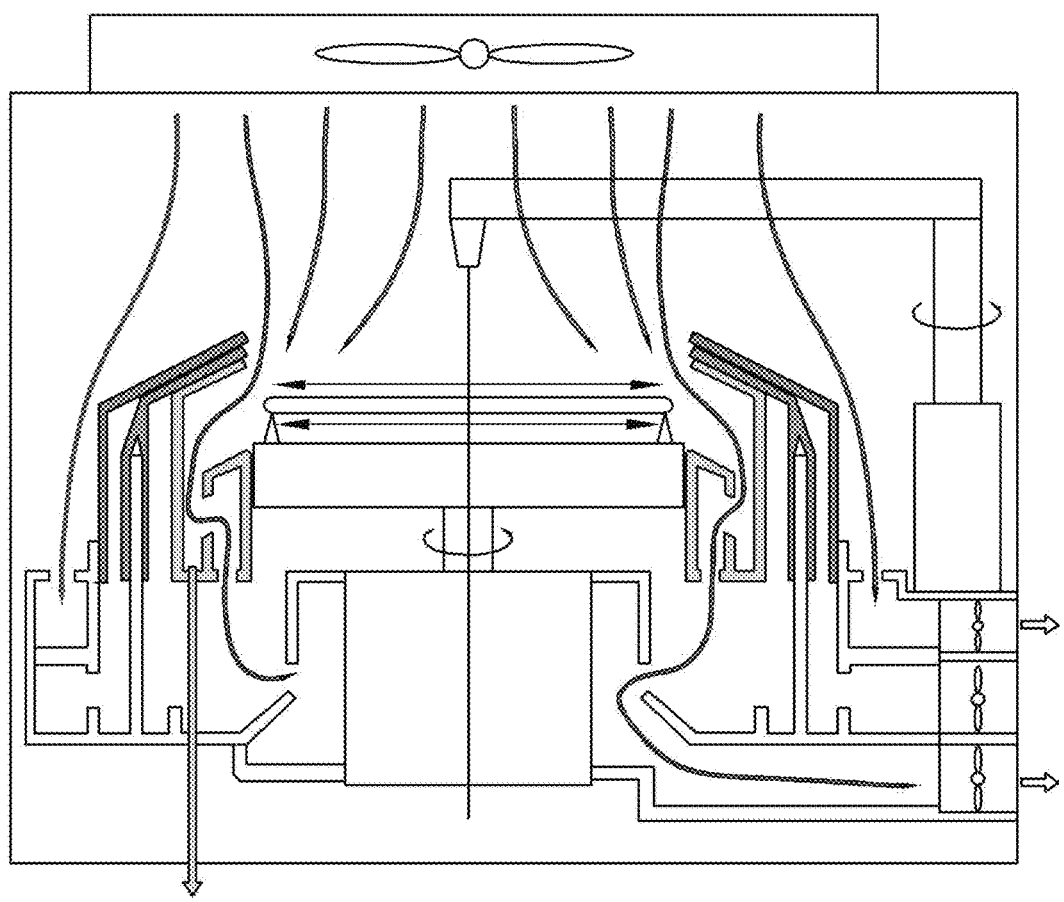
FIG. 3C is a front sectional view showing air flows exhausted through an inner passage of the bowl assembly of FIG. 2.

FIGS. 3A to 3C show air flows exhausted through the outer passage 353, the intermediate passage 352, and the inner passage 351 of the bowl assembly 300 of FIG. 2.

The first process exhaust part 811 may have an automatic damper for gas-liquid separation when isopropyl alcohol (IPA) is used as the treatment liquid.

As described above, the substrate treatment apparatus according to the present invention is configured to have the substrate support assembly having the spin head adapted to seat the substrate thereonto, the fluid supply unit for supplying the fluid to the substrate, the bowl assembly having the plurality of bowls overlaid one another outwardly in a radial direction thereof and surrounding the substrate support assembly, the ascending and descending unit for moving up and down the bowl assembly, and the chamber for accommodating the substrate support assembly, the fluid supply unit, the bowl assembly, and the ascending and descending unit, wherein the chamber is configured to have a plurality of process exhaust parts for performing exhaust from the inside of the bowl assembly and an environment exhaust part for performing exhaust from the outside of the bowl assembly, so that the treatment liquids introduced into the bowl assembly can be sortedly exhausted and collected according to their kinds, and further, the gases generated from the treatment liquids can be sortedly post-treated, thereby greatly reducing the post-treatment costs.

According to the present invention, further, the outer peripheral surface of the bowl assembly is surrounded by the ring-shaped first duct for communicating with the environment exhaust part, and a plurality of first introducing holes are formed with spaced apart from one another along the top periphery thereof to introduce the gases of the treatment liquids existing in the chamber thereinto, so that the droplets generated on the outside of the bowl assembly can be easily exhausted, and as the first duct is disposed to the optimized shape on the circular substrate, accordingly, the first duct can prevent the vortex from occurring when clean air moves down from the fan filter unit disposed on top of the chamber.

According to the present invention, moreover, the outer peripheral surface of the bowl assembly is surrounded by the ring-shaped first duct for communicating with the environment exhaust part and the ring-shaped second duct is disposed adjacent to the first duct thereunder and communicating with the second introducing holes and the first process exhaust part, thereby providing a compact structure.

According to the present invention, also, the inner bowl among the bowls include the ring-shaped introducing groove formed on the outside thereof in up and down directions, the ring-shaped first compartment formed opposite to the introducing groove in a state of placing an inner wall of the introducing groove therebetween, wherein the first connection holes are formed on the inner wall of the introducing groove and communicate with the first compartment, and the first exhaust holes are formed on the bottom of the first compartment and communicate with the second process exhaust part of the process exhaust parts, so that the mist-shaped droplets of the treatment liquid can pass through such a passage relatively complicated in structure, and accordingly, the liquid and gas constituting the droplets can be easily sorted and exhausted.

According to the present invention, in addition, the first connection holes are slant upwardly from the inlets thereof toward the outlets thereof, and accordingly, when the droplets of the passing treatment liquid come into contact with the keen top end portions of the first connection holes and pass therethrough, the separation between the liquid and the gas can be easily carried out.

According to the present invention, further, the inner bowl among the bowls comprises a ring-shaped introducing groove formed on the outside thereof in up and down directions, a ring-shaped first compartment formed opposite to the introducing groove in a state of placing an inner wall of the introducing groove therebetween, wherein first connection holes are formed on the inner wall of the introducing groove and communicate with the first compartment, and first exhaust holes are formed on the bottom of the first compartment and communicate with a second process exhaust part of the process exhaust parts, so that through the additional path, the separation between the liquid and the gas can be more reliably carried out.

The present invention may be modified in various ways and may have several exemplary embodiments. It is therefore intended that the scope of the invention be limited not by this detailed description, but rather by the claims appended hereto, and it should be understood that the invention covers all the modifications, equivalents, and replacements within the idea and technical scope of the invention.

What is claimed is:

1. A substrate treatment apparatus comprising:
 a substrate support assembly having a spin head adapted to seat a substrate thereonto;
 a fluid supply unit for supplying fluid to the substrate;
 a bowl assembly having a plurality of bowls overlaid one another outwardly in a radial direction thereof and surrounding the substrate support assembly;
 an ascending and descending unit for moving up and down the bowl assembly; and
 a chamber for accommodating the substrate support assembly, the fluid supply unit, the bowl assembly, and the ascending and descending unit,
 wherein the chamber is configured to have a plurality of process exhaust parts for performing exhaust from the inside of the bowl assembly and an environment exhaust part for performing exhaust from the outside of the bowl assembly,
 wherein the outer peripheral surface of the bowl assembly is surrounded by a ring-shaped first duct for communicating with the environment exhaust part,
 wherein the first duct has a plurality of first introducing holes spaced apart from one another on top thereof along the periphery thereof to introduce gases of treatment liquids existing in the chamber thereinto.

2. The substrate treatment apparatus according to claim 1, wherein the bowl assembly comprises a ring-shaped outer wall disposed adjacent to an outer bowl among the bowls downwardly and second introducing holes are formed on the outer wall and communicating with a first process exhaust part of the process exhaust parts.

3. The substrate treatment apparatus according to claim 2, wherein the outer peripheral surface of the bowl assembly is surrounded by the ring-shaped first duct for communicating with the environment exhaust part, and a ring-shaped second duct is disposed adjacent to the first duct thereunder and communicating with the second introducing holes and the first process exhaust part.

4. The substrate treatment apparatus according to claim 1, wherein an inner bowl among the bowls comprises a ring-shaped introducing groove formed on the outside thereof in up and down directions, a ring-shaped first compartment formed opposite to the introducing groove in a state of placing an inner wall of the introducing groove therebetween, wherein first connection holes are formed on the inner wall of the introducing groove and communicate with the first compartment, and first exhaust holes are formed on the bottom of the first compartment and communicate with a second process exhaust part of the process exhaust parts.

5. The substrate treatment apparatus according to claim 4, wherein the first connection holes are slant upwardly from inlets thereof toward outlets thereof.

6. The substrate treatment apparatus according to claim 4, wherein the first exhaust holes are long holes extended along the periphery of the inner bowl and spaced apart from one another.

7. The substrate treatment apparatus according to claim 4, wherein a ring-shaped second compartment and a ring-shaped third compartment are formed adjacent to each other in up and down directions on the lower portion of the inner portion spaced apart from the first compartment, the second compartment comprises an introducing hole formed on an outer wall thereof to introduce gases exhausted from the first exhaust holes and second connection holes formed on bottom thereof and communicating with the third compartment, and the third compartment comprises a second exhaust hole communicating with the second process exhaust part.

8. The substrate treatment apparatus according to claim 7, wherein the bowl assembly has the inner bowl, the intermediate bowl, and the outer bowl, a ring-shaped intermediate wall is formed extended downwardly from the intermediate bowl to separate the first process exhaust part and the second process exhaust part from each other, and a passage between the inner bowl and the intermediate bowl communicates with the first exhaust holes, the second exhaust hole and the second process exhaust part, sequentially.

* * * * *